(12) United States Patent
Chen et al.

(10) Patent No.: US 11,778,830 B2
(45) Date of Patent: Oct. 3, 2023

(54) MEMORY STRUCTURE

(71) Applicant: United Microelectronics Corp., Hsinchu (TW)

(72) Inventors: Chia-Hung Chen, Tainan (TW); Yu-Huang Yeh, Hsinchu (TW); Chuan-Fu Wang, Miaoli County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 17/979,789

(22) Filed: Nov. 3, 2022

(65) Prior Publication Data

US 2023/0046058 A1     Feb. 16, 2023

Related U.S. Application Data

(62) Division of application No. 17/201,986, filed on Mar. 15, 2021, now Pat. No. 11,581,325.

(30) Foreign Application Priority Data

Jan. 13, 2021   (CN) .......................... 202110041163.4

(51) Int. Cl.
  *H10B 43/30*   (2023.01)
  *H10B 41/10*   (2023.01)
  *H10B 41/30*   (2023.01)
  *H10B 43/10*   (2023.01)

(52) U.S. Cl.
  CPC ............. *H10B 43/30* (2023.02); *H10B 41/10* (2023.02); *H10B 41/30* (2023.02); *H10B 43/10* (2023.02)

(58) Field of Classification Search
  CPC ........ H10B 43/30; H10B 41/10; H10B 41/30; H10B 43/10; H10B 43/40; H10B 43/50; H01L 29/792; H01L 29/40117; H01L 21/76805
  See application file for complete search history.

(56) References Cited

U.S. PATENT DOCUMENTS

| | | | |
|---|---|---|---|
| 6,927,446 B2 * | 8/2005 | Yoshino | H01L 29/7923 438/257 |
| 7,791,129 B2 * | 9/2010 | Terai | H10B 43/30 257/411 |
| 8,871,595 B2 | 10/2014 | Ramkumar et al. | |

OTHER PUBLICATIONS

Jae Sung Sim et al., "Self Aligned Trap-Shallow Trench Isolation Scheme for the Reliability of TANOS (TaN/Al0/SiN/Oxide/Si) NAND Flash Memory," 2007 22nd IEEE Non-Volatile Semiconductor Memory Workshop, Aug. 2007, pp. 110-111.

* cited by examiner

*Primary Examiner* — Allison Bernstein
(74) *Attorney, Agent, or Firm* — JCIPRNET

(57) ABSTRACT

A memory structure including a substrate, a first dielectric layer, a second dielectric layer, a charge storage layer, an oxide layer, and a conductive layer is provided. The first dielectric layer is disposed on the substrate. The second dielectric layer is disposed on the first dielectric layer. The charge storage layer is disposed between the first dielectric layer and the second dielectric layer. The oxide layer is located at two ends of the charge storage layer and is disposed between the first dielectric layer and the second dielectric layer. The conductive layer is disposed on the second dielectric layer.

7 Claims, 14 Drawing Sheets

MEMORY STRUCTURE

CROSS-REFERENCE TO RELATED APPLICATION

This application is a divisional application of and claims the priority benefit of U.S. patent application Ser. No. 17/201,986, filed on Mar. 15, 2021, which claims the priority benefit of Chinese patent application serial no. 202110041163.4, filed on Jan. 13, 2021. The entirety of each of the above-mentioned patent applications is hereby incorporated by reference herein and made a part of this specification.

BACKGROUND OF THE INVENTION

Field of the Invention

The invention relates to a semiconductor structure and a manufacturing method thereof, and particularly relates to a memory structure and a manufacturing method thereof.

Description of Related Art

Memory devices used to store data can be divided into volatile memory and non-volatile memory. The non-volatile memory device can perform multiple data operation such as storing, reading, and erasing, and has advantages such as the stored data does not disappear when the power supply is interrupted, short data access time, and low power consumption, and therefore has currently become a memory device widely used in personal computers and electronic products. However, when the charge stored in the non-volatile memory is lost, the data retention capacity and the reliability of the memory device will decrease.

SUMMARY OF THE INVENTION

The invention provides a memory structure and a manufacturing method thereof, which can effectively prevent charge loss, thereby improving the data retention capacity and the reliability of the memory device.

The invention provides a memory structure, which includes a substrate, a first dielectric layer, a second dielectric layer, a charge storage layer, an oxide layer, and a conductive layer. The first dielectric layer is disposed on the substrate. The second dielectric layer is disposed on the first dielectric layer. The charge storage layer is disposed between the first dielectric layer and the second dielectric layer. The oxide layer is located at two ends of the charge storage layer and is disposed between the first dielectric layer and the second dielectric layer. The conductive layer is disposed on the second dielectric layer.

According to an embodiment of the invention, in the memory structure, the oxide layer may be connected between the bottom surface of the second dielectric layer and the top surface of the first dielectric layer.

According to an embodiment of the invention, in the memory structure, the first dielectric layer, the second dielectric layer, and the oxide layer may surround the charge storage layer.

According to an embodiment of the invention, in the memory structure, the conductive layer may cover the sidewall of the oxide layer.

According to an embodiment of the invention, in the memory structure, the material of the first dielectric layer is, for example, oxide. The material of the second dielectric layer is, for example, oxide. The material of the charge storage layer is, for example, nitride.

According to an embodiment of the invention, the memory structure may further include an isolation structure. The isolation structure is located in the substrate.

According to an embodiment of the invention, in the memory structure, the oxide layer may be located above the isolation structure.

According to an embodiment of the invention, in the memory structure, a portion of the first dielectric layer, a portion of the charge storage layer, and a portion of the second dielectric layer may be located above the isolation structure.

According to an embodiment of the invention, in the memory structure, the upper surface of the isolation structure may have a recess. The recess may be adjacent to the substrate.

According to an embodiment of the invention, in the memory structure, the upper surface of the isolation structure may be a flat surface.

The invention provides a manufacturing method of a memory structure, which includes the following steps. A substrate is provided. A first dielectric material layer is formed on the substrate. A charge storage material layer is formed on the first dielectric material layer. A second dielectric material layer is formed on the charge storage material layer. A patterning process is performed on the second dielectric material layer, the charge storage material layer, and the first dielectric material layer to form a second patterned dielectric material layer, a patterned charge storage material layer, and a first patterned dielectric material layer. An oxidation process is performed on the patterned charge storage material layer to form an oxide material layer at the end of the patterned charge storage material layer. A conductive layer is formed on the second patterned dielectric material layer. A portion of the second patterned dielectric material layer, a portion of the patterned charge storage material layer, a portion of the oxide material layer, and a portion of the first patterned dielectric material layer are removed by using the conductive layer as a mask to form a second dielectric layer, a charge storage layer, an oxide layer, and a first dielectric layer, wherein the oxide layer is located at two ends of the charge storage layer.

According to an embodiment of the invention, in the manufacturing method of the memory structure, the gas used in the oxidation process may include hydrogen ($H_2$), nitrous oxide ($N_2O$), oxygen ($O_2$), or ozone ($O_3$).

According to an embodiment of the invention, in the manufacturing method of the memory structure, the temperature range of the oxidation process is, for example, 800° C. to 900° C.

According to an embodiment of the invention, in the manufacturing method of the memory structure, the time range of the oxidation process is, for example, 10 seconds to 60 seconds.

According to an embodiment of the invention, in the manufacturing method of the memory structure, the pressure range of the oxidation process is, for example, 2 Torr to 8 Torr.

According to an embodiment of the invention, in the manufacturing method of the memory structure, the top view shape of the oxide material layer may be a ring shape. The oxide material layer may surround the patterned charge storage material layer.

According to an embodiment of the invention, in the manufacturing method of the memory structure, the patterning process may include the following steps. A patterned photoresist layer is formed on the second dielectric material layer. A portion of the second dielectric material layer, a portion of the charge storage material layer, and a portion of the first dielectric material layer are removed by using the patterned photoresist layer as a mask to form the second patterned dielectric material layer, the patterned charge storage material layer, and the first patterned dielectric material layer.

According to an embodiment of the invention, the manufacturing method of the memory structure may further include the following step. The patterned photoresist layer is removed.

According to an embodiment of the invention, in the manufacturing method of the memory structure, the oxidation process may be performed on the patterned charge storage material layer before removing the patterned photoresist layer.

According to an embodiment of the invention, in the manufacturing method of the memory structure, the oxidation process may be performed on the patterned charge storage material layer after removing the patterned photoresist layer.

Based on the above description, in the memory structure and the manufacturing method thereof according to the invention, since the oxide layer is located at the two ends of the charge storage layer, the two ends of the charge storage layer can be sealed by the oxide layer to prevent charge loss from the two ends of the charge storage layer, thereby improving the data retention capacity and the reliability of the memory device. In addition, in the manufacturing method of the memory structure according to the invention, although the etching process used to form the first patterned dielectric material layer, the patterned charge storage material layer, and the second patterned dielectric material layer may damage the sidewall of the first patterned dielectric material layer, the sidewall of the patterned charge storage material layer, and the sidewall of the second patterned dielectric material layer, the sidewall damage of the first patterned dielectric material layer, the patterned charge storage material layer, and the second patterned dielectric material layer can be repaired by the oxidation process.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1F are top views illustrating a manufacturing process of a memory structure according to an embodiment of the invention. FIG. 2A to FIG. 2F are cross-sectional views taken along section line I-I' in FIG. 1A to FIG. 1F. FIG. 3 is a sectional view taken along section line II-II' in FIG. 1F.

Figure 1A:
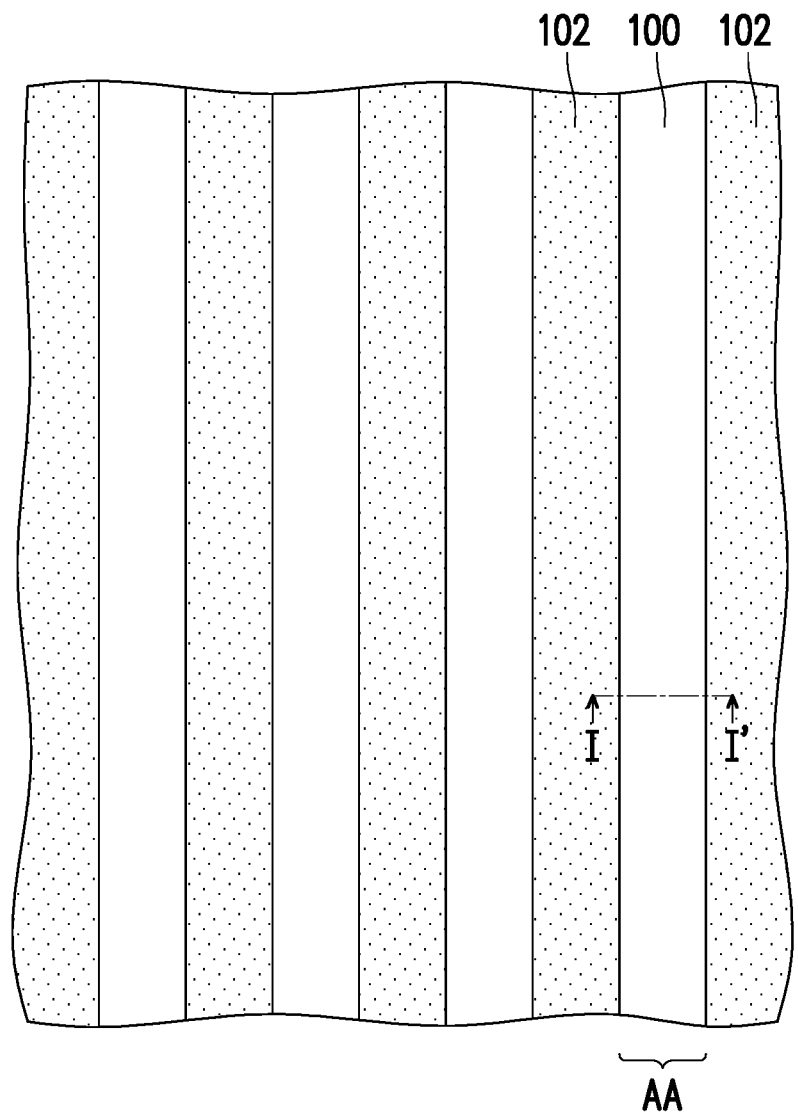
FIG. 1A to FIG. 1F are top views illustrating a manufacturing process of a memory structure according to an embodiment of the invention.
Figure 2A:
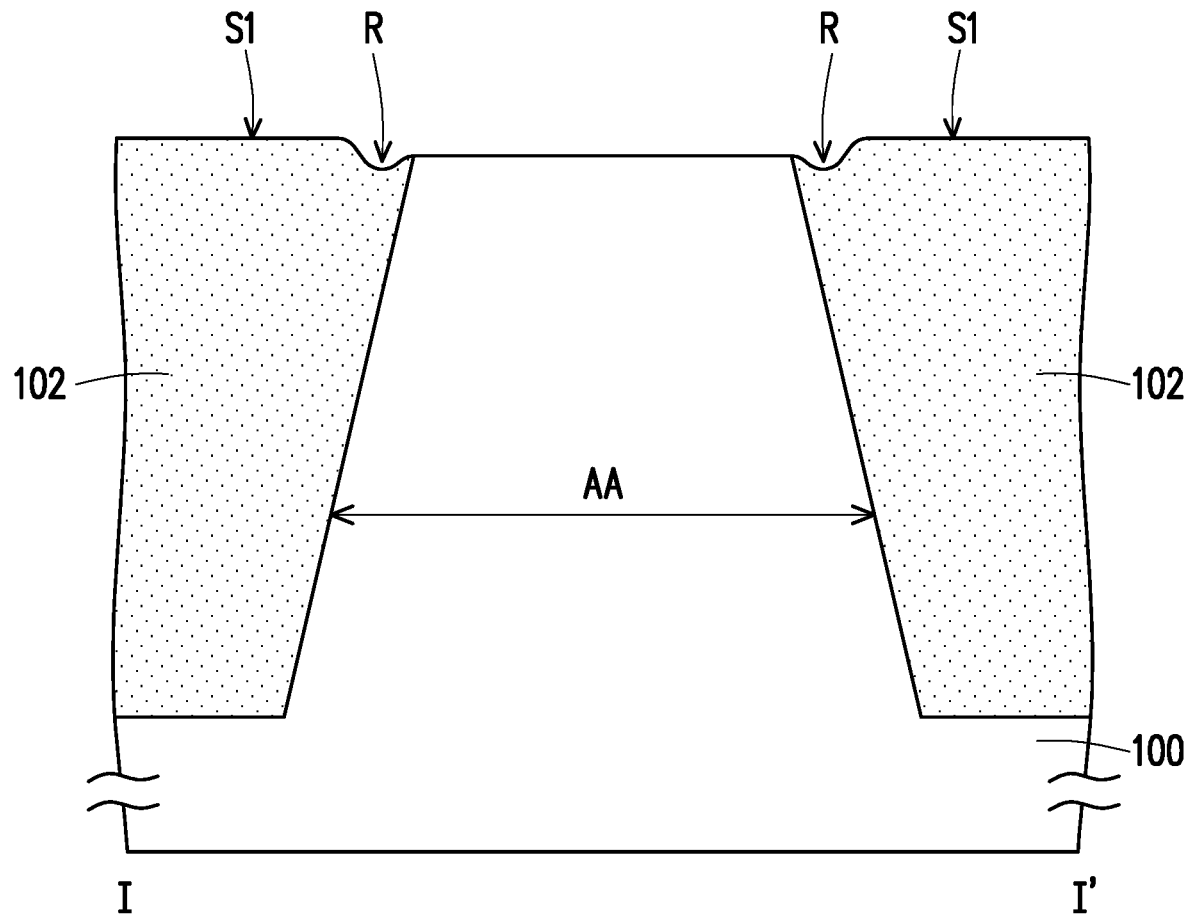
FIG. 2A to FIG. 2F are cross-sectional views taken along section line I-I' in FIG. 1A to FIG. 1F.
Figure 3:
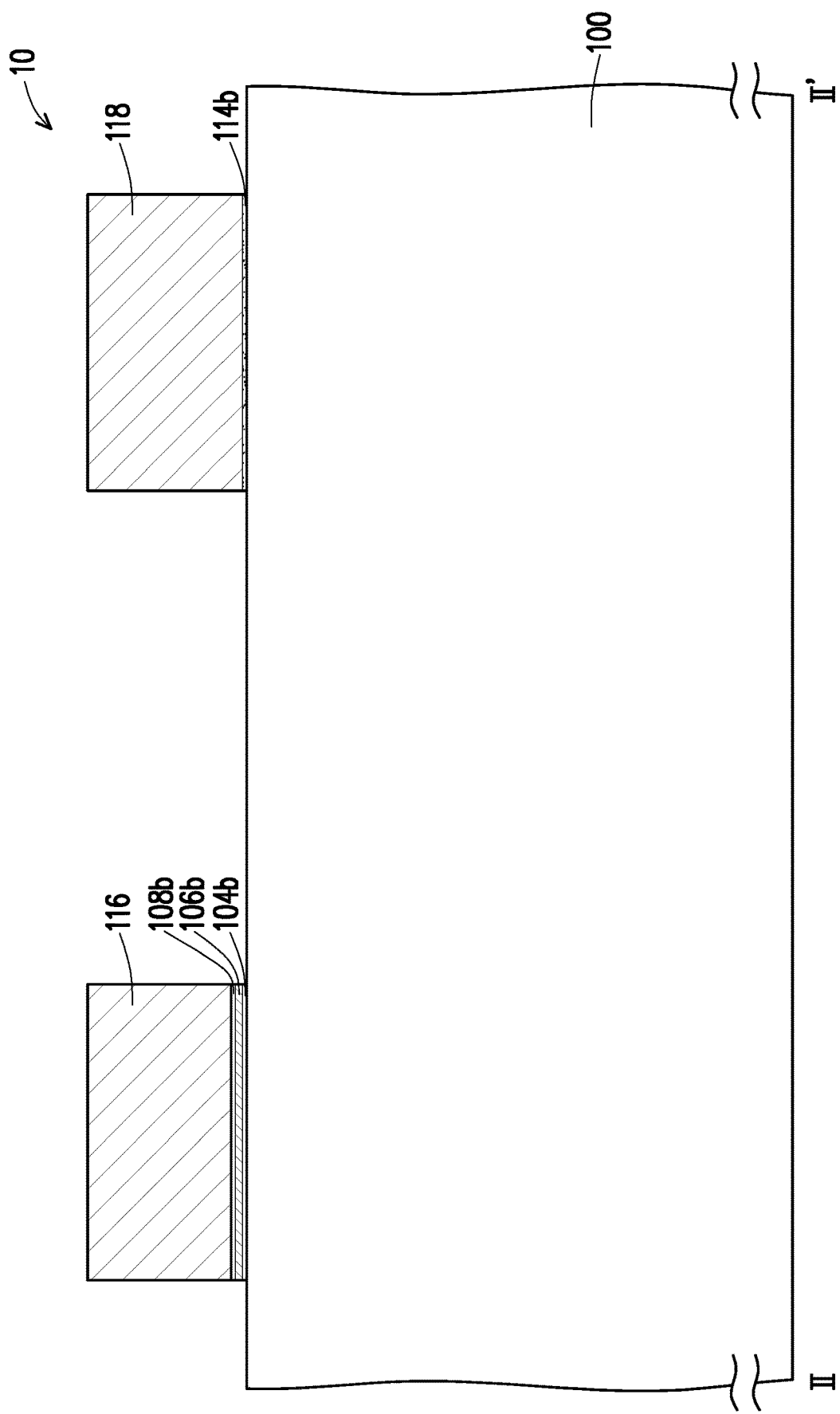
FIG. 3 is a sectional view taken along section line II-II' in FIG. 1F.
Figure 4:
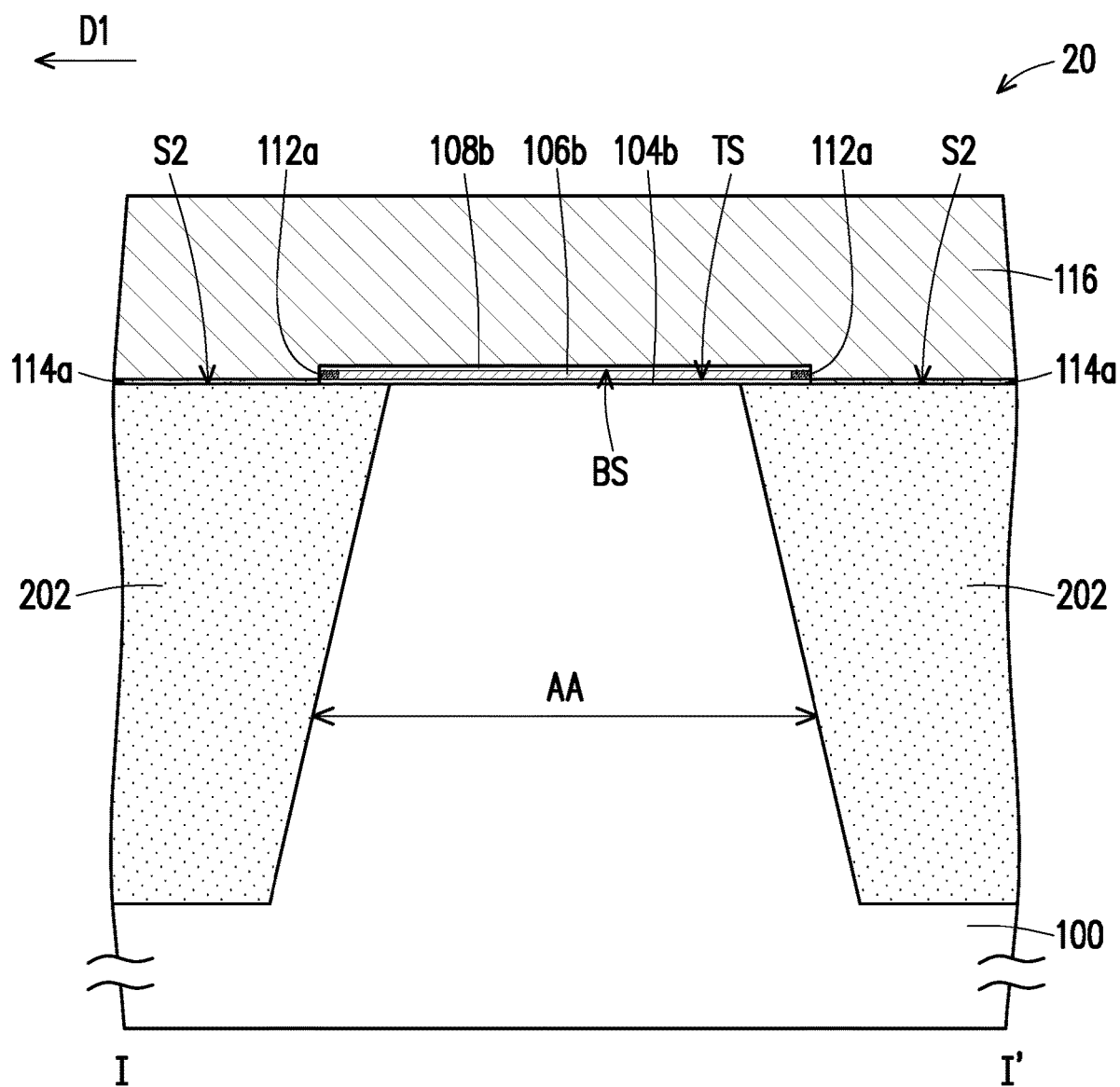
FIG. 4 is a cross-sectional view illustrating a memory structure according to other embodiment of the invention.

Referring to FIG. 1A and FIG. 2A, a substrate 100 is provided. The substrate 100 may be a semiconductor substrate such as a silicon substrate. In addition, there may be an isolation structure 102 in the substrate 100. The isolation structure 102 can define the active area AA in the substrate 100. The upper surface S1 of the isolation structure 102 may have a recess R. The recess R may be adjacent to substrate 100. In the present embodiment, although the upper surface S1 of the isolation structure 102 has the recess as an example, the invention is not limited thereto. In other embodiments, as shown in FIG. 4, the upper surface S2 of the isolation structure 202 may be a flat surface. The isolation structure 102 is, for example, a shallow trench isolation structure. The material of the isolation structure 102 is, for example, silicon oxide.

Figure 1B:
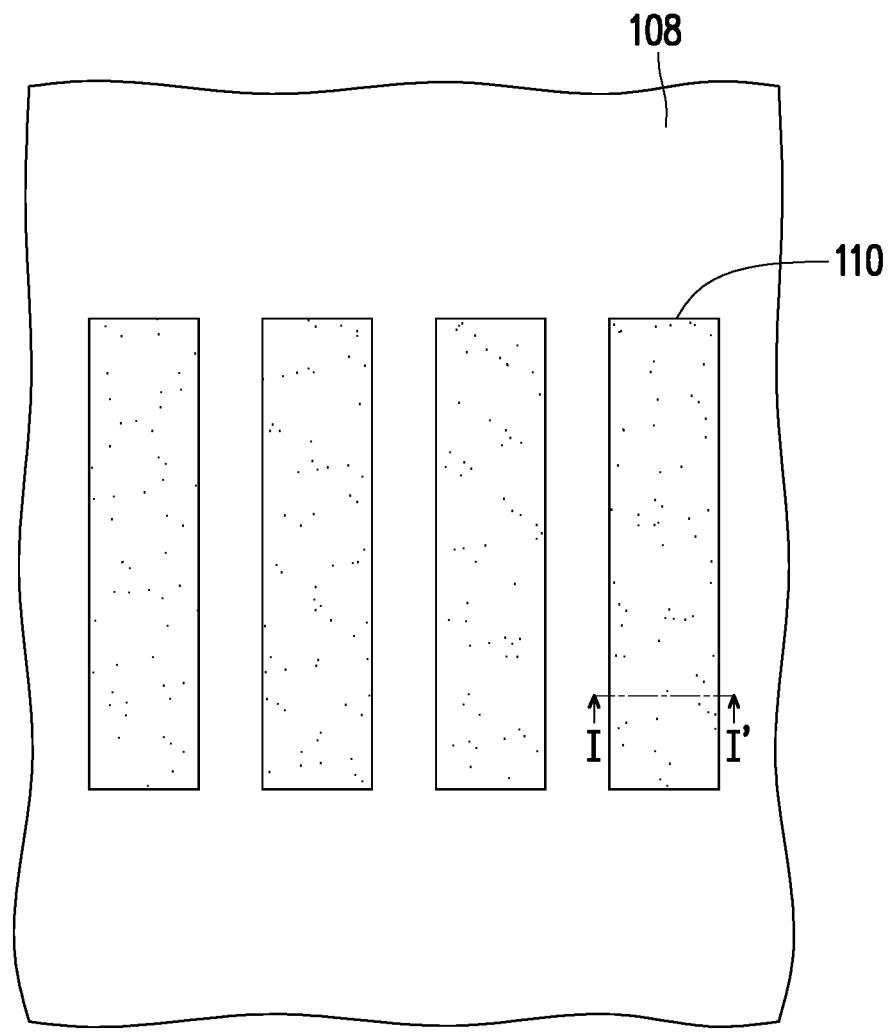
Figure 2B:
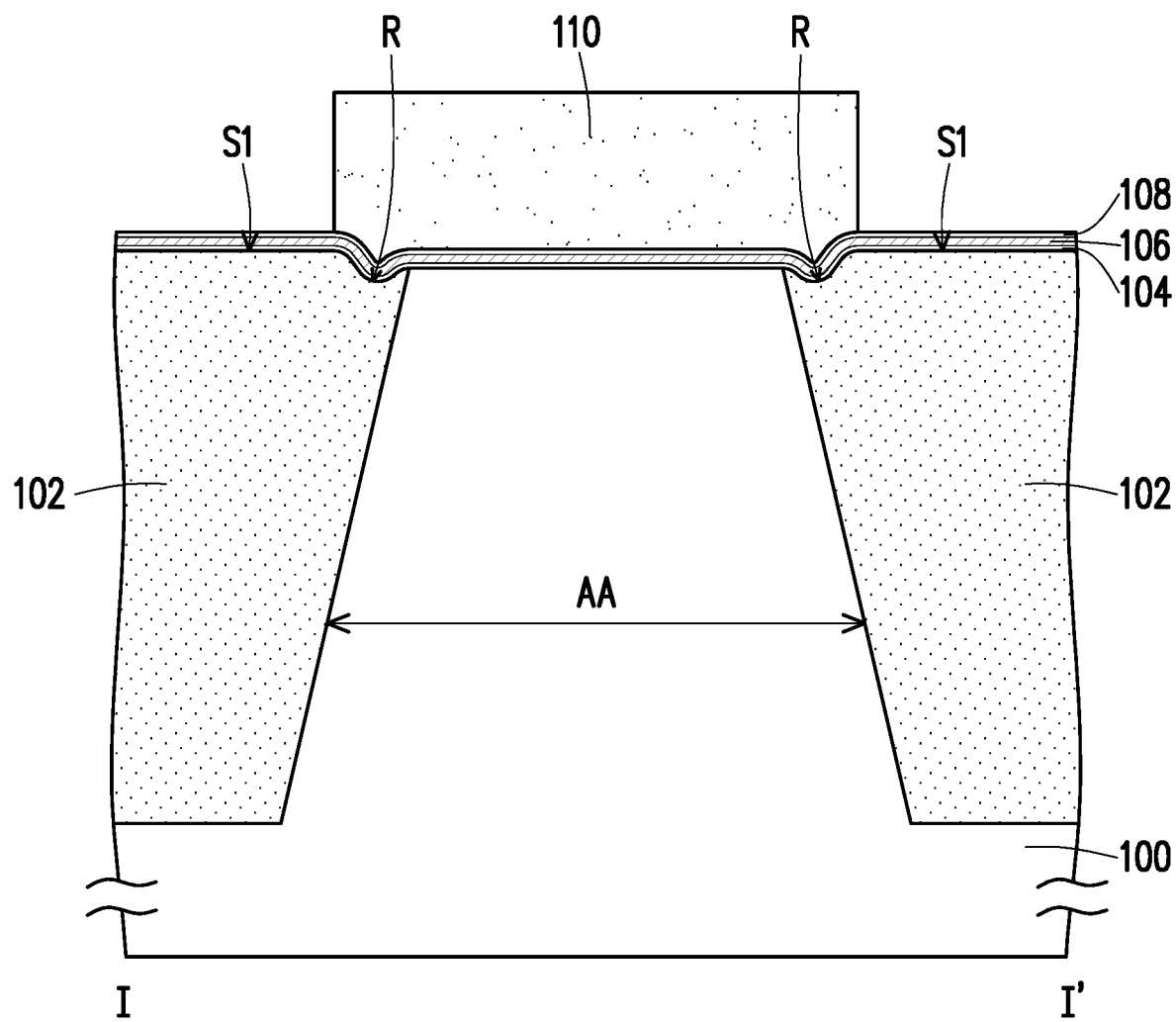

Referring to FIG. 1B and FIG. 2B, a dielectric material layer 104 is formed on the substrate 100. The material of the dielectric material layer 104 is, for example, oxide such as silicon oxide. The method of forming the dielectric material layer 104 is, for example, a thermal oxidation method or a chemical vapor deposition method. In some embodiments, the dielectric material layer 104 may be further formed on the isolation structure 102. In some embodiments, although not shown in FIG. 2B, when the dielectric material layer 104 is formed by the thermal oxidation method, the thickness of the dielectric material layer 104 located on the substrate 100 may be greater than the thickness of the dielectric material layer 104 located on the isolation structure 102.

A charge storage material layer 106 is formed on the dielectric material layer 104. The material of the charge storage material layer 106 may be a charge trapping material. In some embodiments, the material of the charge storage material layer 106 is, for example, nitride such as silicon nitride. The method of forming the charge storage material layer 106 is, for example, a chemical vapor deposition method.

A dielectric material layer 108 is formed on the charge storage material layer 106. The material of the dielectric material layer 108 is, for example, oxide such as silicon oxide. The method of forming the dielectric material layer 104 is, for example, a chemical vapor deposition method.

A patterned photoresist layer 110 may be formed on the dielectric material layer 108. The patterned photoresist layer 110 may expose a portion of the dielectric material layer 108. The patterned photoresist layer 110 may be formed by a lithography process.

Figure 1C:
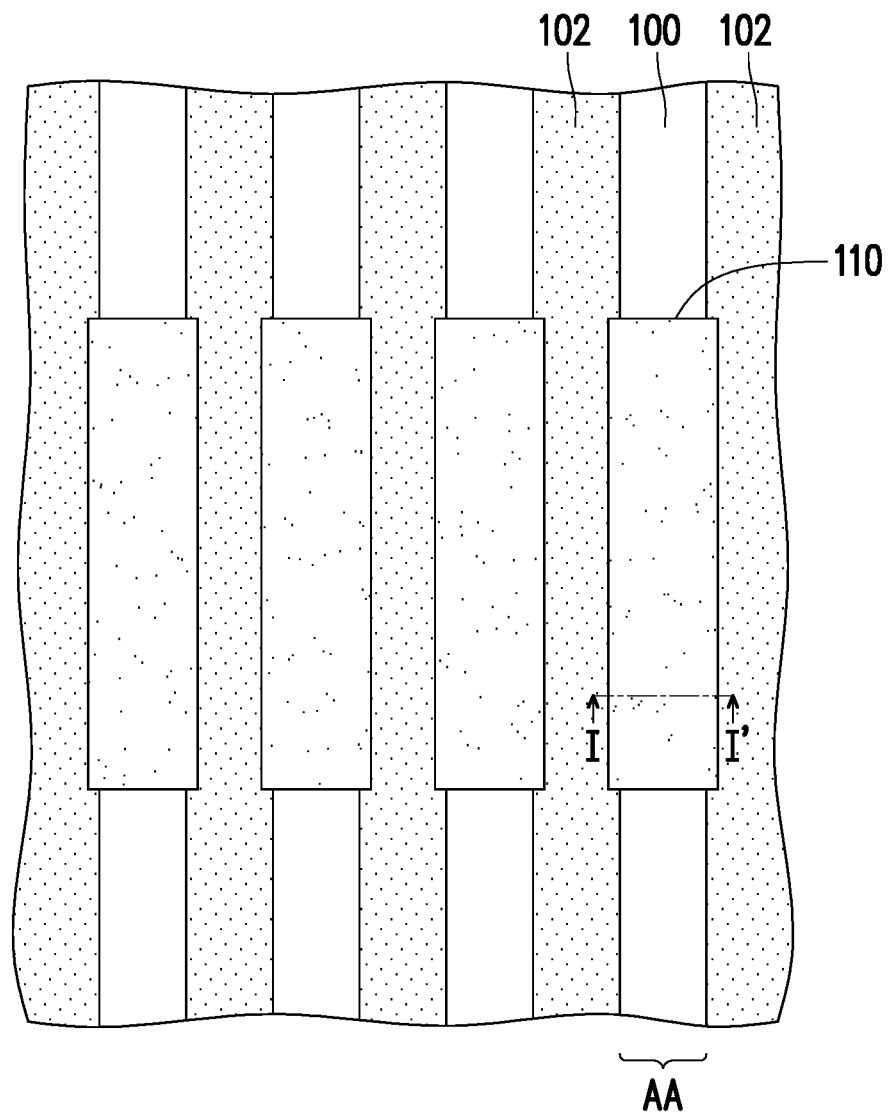
Figure 2C:
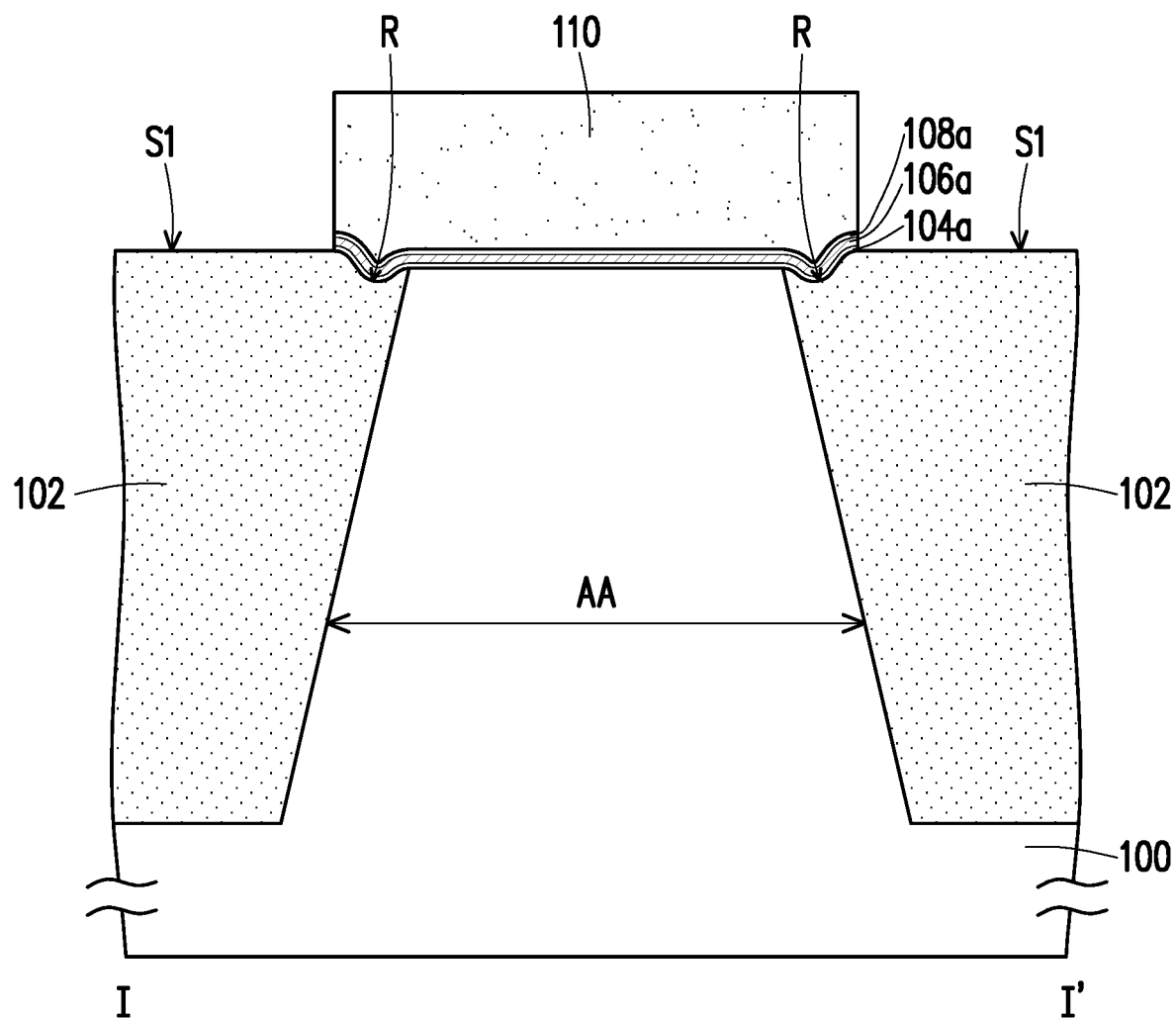

Referring to FIG. 1C and FIG. 2C, a portion of the dielectric material layer 108, a portion of the charge storage material layer 106, and a portion of the dielectric material layer 104 may be removed by using the patterned photoresist layer 110 as a mask. Thereby, a patterning process may be performed on the dielectric material layer 108, the charge storage material layer 106, and the dielectric material layer 104 to form a patterned dielectric material layer 108a, a patterned charge storage material layer 106a, and a patterned dielectric material layer 104a. The method of removing a portion of the dielectric material layer 108, a portion of the charge storage material layer 106, and a portion of the dielectric material layer 104 is, for example, a dry etching method.

Figure 1D:
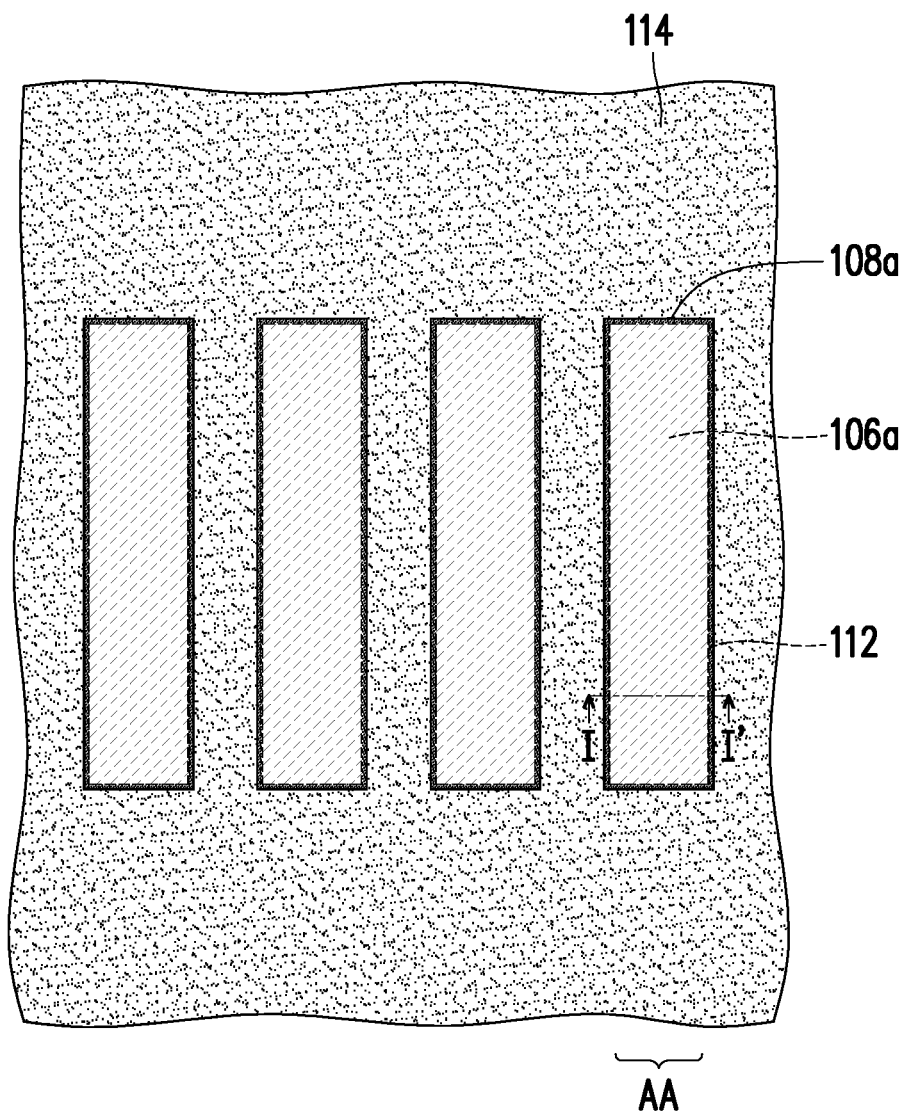
Figure 2D:
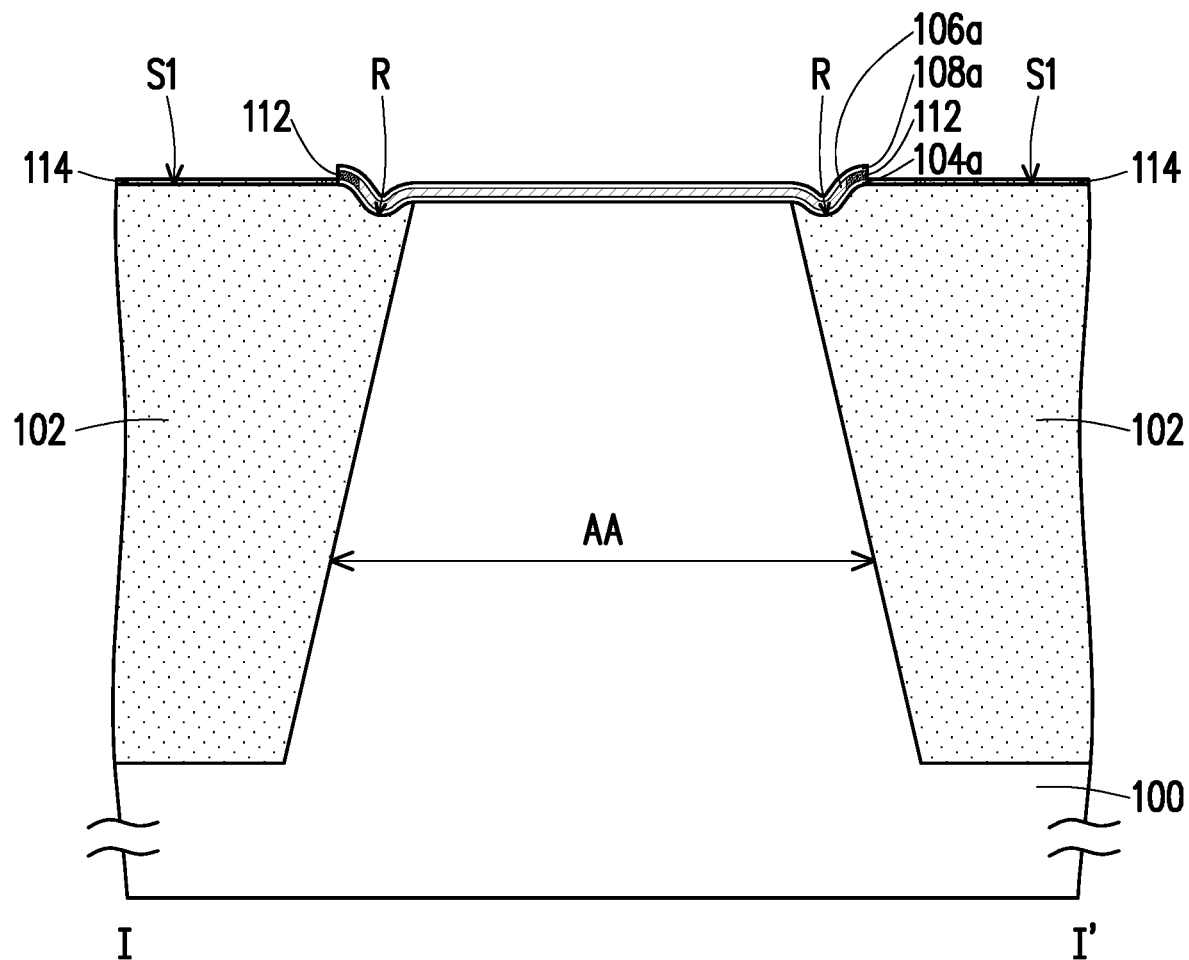

Referring to FIG. 1D and FIG. 2D, an oxidation process is performed on the patterned charge storage material layer 106a to form an oxide material layer 112 at the end of the patterned charge storage material layer 106a. The top view shape of the oxide material layer 112 may be a ring shape (FIG. 1D). In addition, the oxide material layer 112 may surround the patterned charge storage material layer 106a (FIG. 1D). The material of the oxide material layer 112 is, for example, silicon oxide. In some embodiments, an oxide material layer 114 may be simultaneously formed on the substrate 100 not covered by the patterned dielectric material layer 104a by the oxidation process. In some embodiments, the oxide material layer 114 may be further formed on the isolation structure 102. In some embodiments, when the oxide material layer 114 is formed by the oxidation process, the thickness of the oxide material layer 114 located on the substrate 100 may be greater than the thickness of the oxide material layer 114 located on the isolation structure 102. The material of the oxide material layer 114 is, for example, silicon oxide. The gas used in the oxidation process may include hydrogen ($H_2$), nitrous oxide ($N_2O$), oxygen ($O_2$), or ozone ($O_3$). The temperature range of the oxidation process is, for example, 800° C. to 900° C. The time range of the oxidation process is, for example, 10 seconds to 60 seconds. The pressure range of the oxidation process is, for example, 2 Torr to 8 Torr.

Furthermore, although the etching process used to form the patterned dielectric material layer 104a, the patterned charge storage material layer 106a, and the patterned dielectric material layer 108a may damage the sidewall of the patterned dielectric material layer 104a, the sidewall of the patterned charge storage material layer 106a, and the sidewall of the patterned dielectric material layer 108a, the sidewall damage of the patterned dielectric material layer 104a, the patterned charge storage material layer 106a, and the patterned dielectric material layer 108a can be repaired by the oxidation process.

The patterned photoresist layer 110 may be removed. The method of removing the patterned photoresist layer 110 is, for example, a dry stripping method or a wet stripping method. In the present embodiment, although the oxidation process is performed on the patterned charge storage material layer 106a to form the oxide material layer 112 before removing the patterned photoresist layer 110, the invention is not limited thereto. In other embodiments, the oxidation process may be performed on the patterned charge storage material layer 106a to form the oxide material layer 112 after removing the patterned photoresist layer 110.

Figure 1E:
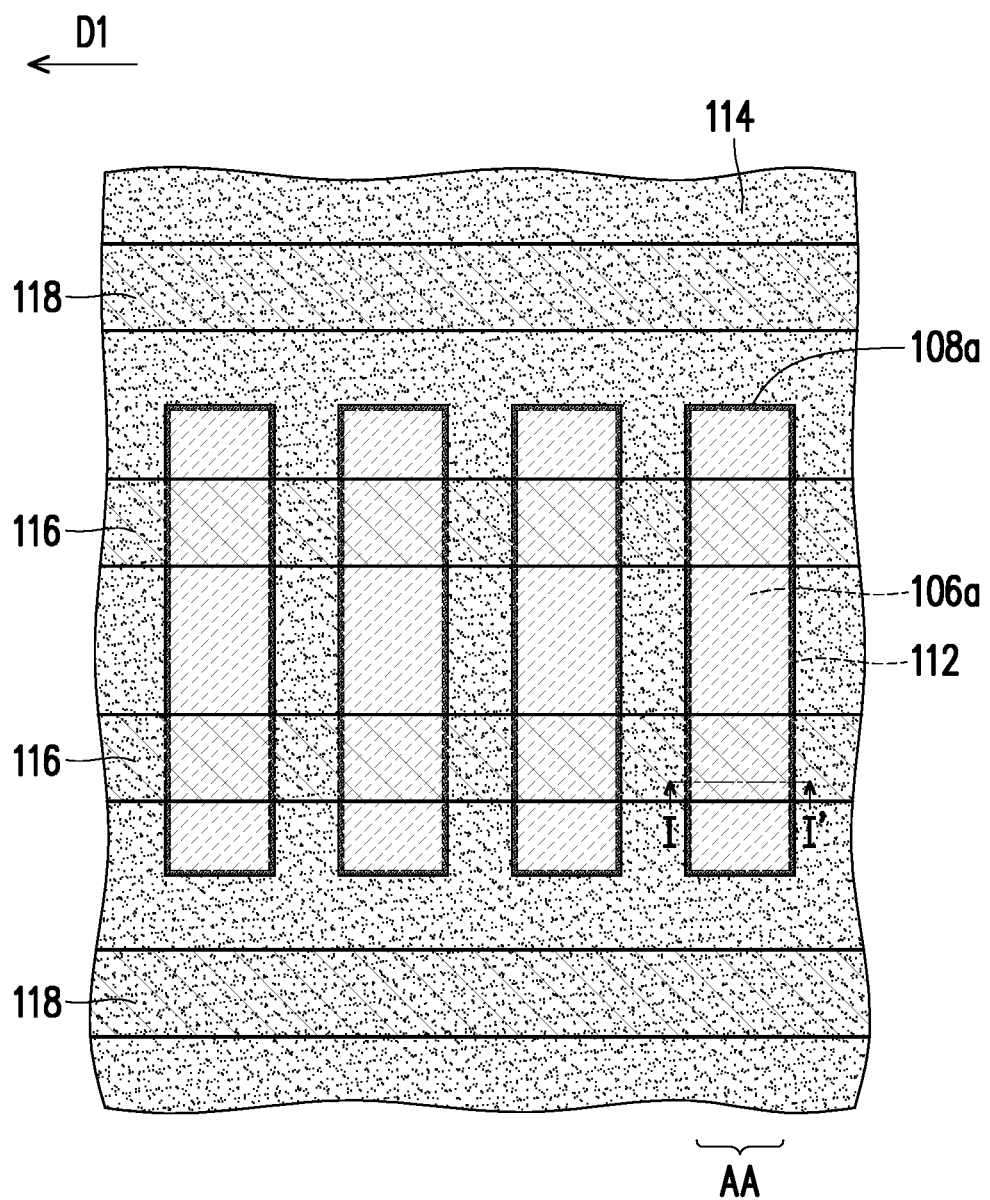
Figure 2E:
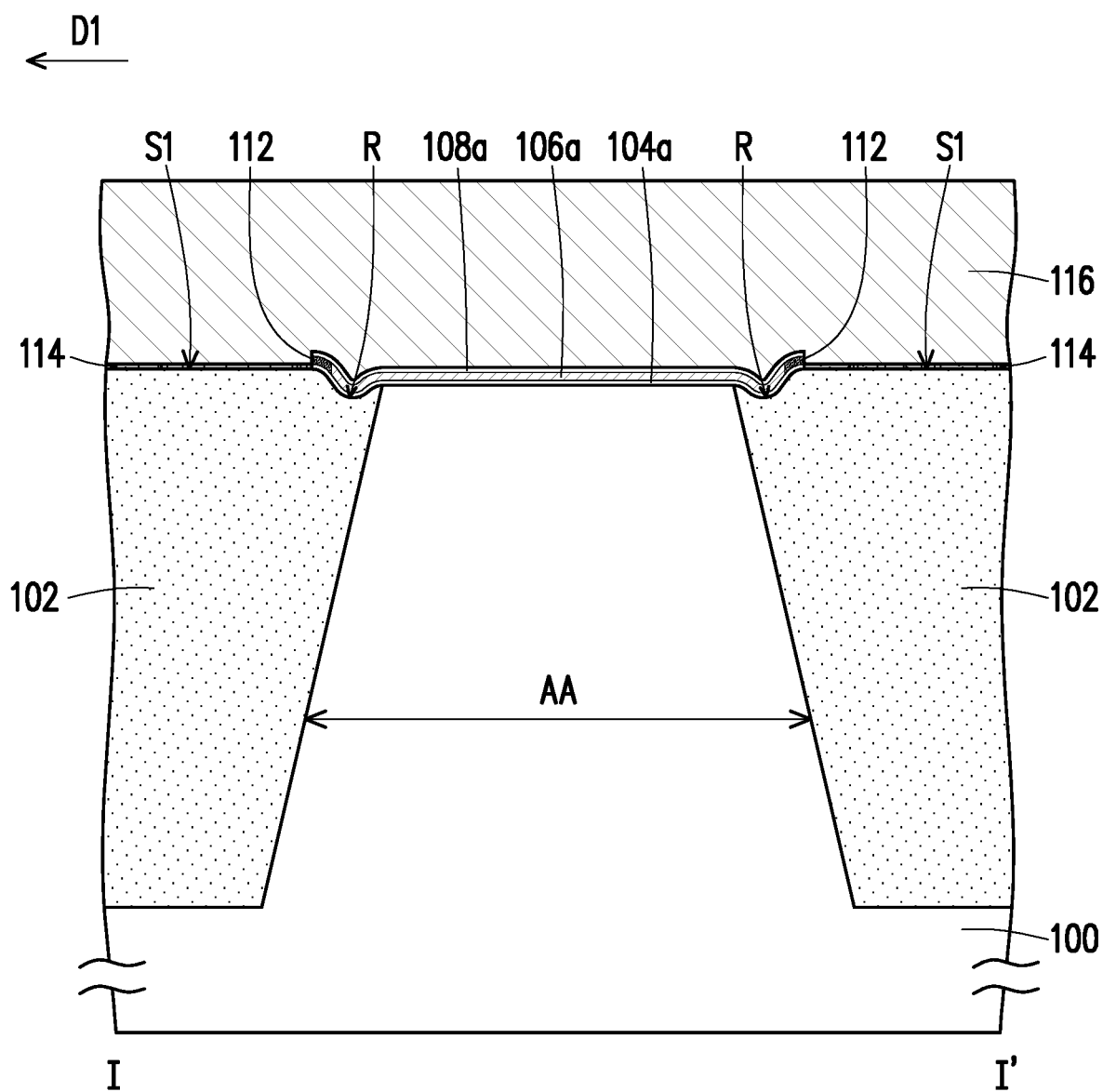

Referring to FIG. 1E and FIG. 2E, a conductive layer 116 is formed on the patterned dielectric material layer 108a. In some embodiments, a portion of the conductive layer 116 may be located on the oxide material layer 114. The conductive layer 116 may be used as a control gate. In addition, a conductive layer 118 may be formed on the oxide material layer 114 (FIG. 1E). Referring to FIG. 1E, the conductive layer 118 may be used as a select gate. The conductive layer 116 and the conductive layer 118 may extend along the direction D1. The material of the conductive layer 116 and the conductive layer 118 is, for example, doped polysilicon. The method of forming the conductive layer 116 and the conductive layer 118 may include the following steps, but the invention is not limited thereto. A conductive material layer (not shown) covering the patterned dielectric material layer 108a and the oxide material layer 114 may be formed. Then, the conductive material layer may be patterned by a lithography process and an etching process to form the conductive layer 116 and the conductive layer 118.

Figure 1F:
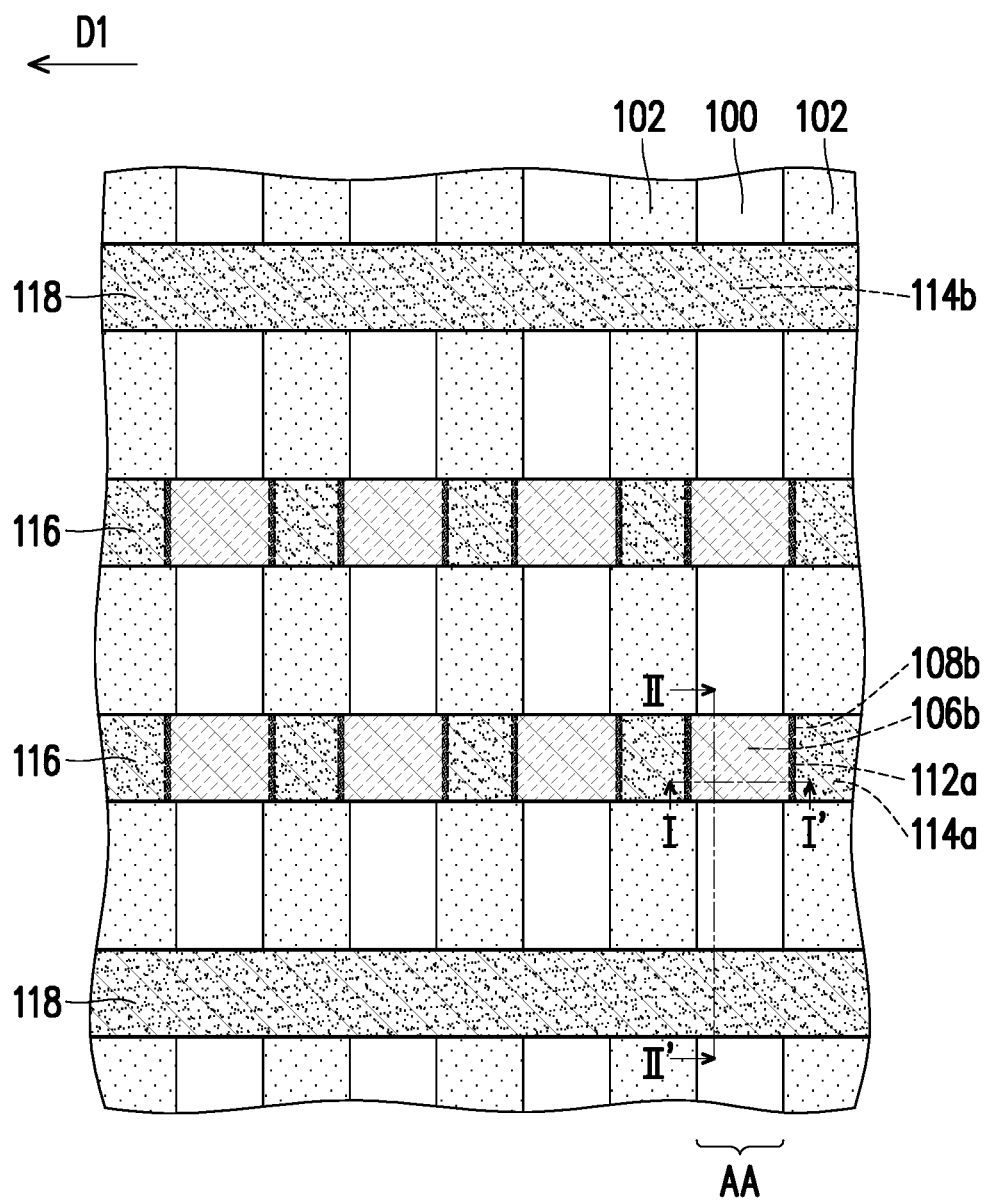
Figure 2F:
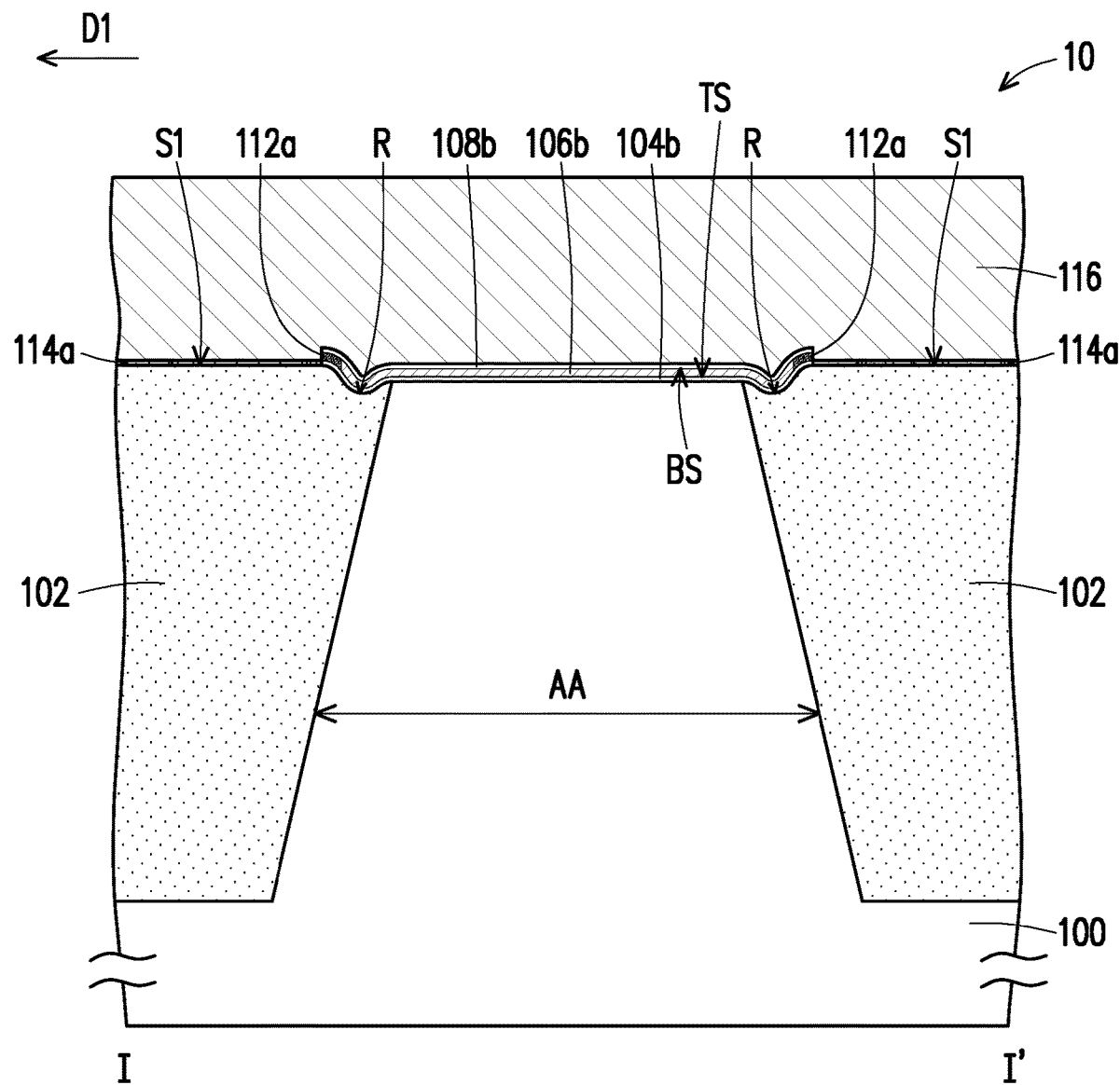

Referring to FIG. 1F, FIG. 2F, and FIG. 3, a portion of the patterned dielectric material layer 108a, a portion of the patterned charge storage material layer 106a, a portion of the oxide material layer 112, and a portion of the patterned dielectric material layer 104a are removed by using the conductive layer 116 as a mask to form a dielectric layer 108b, a charge storage layer 106b, an oxide layer 112a, and a dielectric layer 104b, wherein the oxide layer 112a is located at two ends of the charge storage layer 106b. Since the oxide layer 112a is located at the two ends of the charge storage layer 106b, the two ends of the charge storage layer 106b can be sealed by the oxide layer 112a to prevent charge loss from the two ends of the charge storage layer 106b, thereby improving the data retention capacity and the reliability of the memory device. For example, the oxide layer 112a may be located at two opposite ends of the charge storage layer 106b in the direction D1. The method of removing a portion of the patterned dielectric material layer 108a, a portion of the patterned charge storage material layer 106a, a portion of the oxide material layer 112, and a portion of the patterned dielectric material layer 104a is, for example, a dry etching method.

Furthermore, a portion of the oxide material layer 114 may be removed by using the conductive layer 116 and the conductive layer 118 as a mask to form an oxide layer 114a located under the conductive layer 116 and to form an oxide layer 114b located under the conductive layer 118. The oxide layer 114b may be used as a gate dielectric layer under the conductive layer 118 (select gate). In the present embodiment, although the gate dielectric layer under the conductive layer 118 (select gate) is, for example, the oxide layer 114b, the invention is not limited thereto. In other embodiments, the oxide material layer 114 in FIG. 1D may be removed, and then a new dielectric layer may be formed on the substrate 100, and the dielectric layer may be patterned to form a gate dielectric layer under the conductive layer 118. The method of removing a portion of the oxide material layer 114 is, for example, a dry etching method.

Moreover, in the subsequent manufacturing process, the required components (not shown) such as spacers, doped regions, and interconnect structures may be formed according to product requirements, which are known to one of ordinary skill in the art, and therefore the description thereof is omitted here.

Hereinafter, the memory structure 10 of the present embodiment will be described with reference to FIG. 1F and FIG. 2F. In addition, although the method of forming the memory structure 10 is described by taking the above method as an example, the invention is not limited thereto.

Referring to FIG. 1F and FIG. 2F, the memory structure 10 includes the substrate 100, the dielectric layer 104b, the dielectric layer 108b, the charge storage layer 106b, the oxide layer 112a, and the conductive layer 116. The memory structure 10 may be a non-volatile memory such as a semiconductor-oxide-nitride-oxide-semiconductor (SONOS) memory. The dielectric layer 104b is disposed on the substrate 100. The material of the dielectric layer 104b is, for example, oxide such as silicon oxide. The dielectric layer 108b is disposed on the dielectric layer 104b. The material of the dielectric layer 108b is, for example, oxide such as silicon oxide. The charge storage layer 106b is disposed between the dielectric layer 104b and the dielectric layer 108b. The material of the charge storage layer 106b is, for example, nitride such as silicon nitride. The oxide layer 112a is located at the two ends of the charge storage layer 106b and is disposed between the dielectric layer 104b and the dielectric layer 108b. For example, the oxide layer 112a may be connected between the bottom surface BS of the dielectric layer 108b and the top surface TS of the dielectric layer 104b. The material of the oxide layer 112a is, for example, silicon oxide. The dielectric layer 104b, the dielectric layer 108b, and the oxide layer 112a may surround the charge storage layer 106b (FIG. 2F). The conductive layer 116 is disposed on the dielectric layer 108b. In some embodiments, the conductive layer 116 may cover the sidewall of the oxide layer 112a (FIG. 2F).

In addition, the memory structure 10 may further include an isolation structure 102. The isolation structure 102 is located in substrate 100. The oxide layer 112a may be located above the isolation structure 102. Furthermore, a portion of the dielectric layer 104b, a portion of the charge storage layer 106b, and a portion of the dielectric layer 108b may be located above the isolation structure 102. The upper surface S1 of the isolation structure 102 may have the recess R. The recess R may be adjacent to substrate 100.

Moreover, the material, the arrangement, the forming method, the effect and the like of each component in the memory structure 10 have been described in detail in the above embodiments and are not repeated herein.

Based on the above embodiments, in the memory structure 10 and the manufacturing method thereof, since the oxide layer 112a is located at the two ends of the charge storage layer 106b, the two ends of the charge storage layer 106b can be sealed by the oxide layer 112a to prevent charge loss from the two ends of the charge storage layer 106b, thereby improving the data retention capacity and the reliability of the memory device. In addition, in the manufacturing method of the memory structure 10, although the etching process used to form the patterned dielectric material layer 104a, the patterned charge storage material layer 106a, and the patterned dielectric material layer 108a may damage the sidewall of the patterned dielectric material layer 104a, the sidewall of the patterned charge storage material layer 106a, and the sidewall of the patterned dielectric material layer 108a, the sidewall damage of the patterned dielectric material layer 104a, the patterned charge storage material layer 106a, and the patterned dielectric material layer 108a can be repaired by the oxidation process.

FIG. 4 is a cross-sectional view illustrating a memory structure according to other embodiment of the invention.

Referring to FIG. 2F and FIG. 4, the difference between the memory structure 20 of FIG. 4 and the memory structure 10 of FIG. 2F is as follows. In memory structure 10, the upper surface S1 of the isolation structure 102 may have the recess R. However, in the memory structure 20, the upper surface S2 of the isolation structure 202 may be a flat surface. In addition, the same components in the memory structure 20 and the memory structure 10 are represented by the same reference numerals and are not repeated herein.

In summary, in the memory structure and the manufacturing method thereof in the above embodiments, since the oxide layer is located at the two ends of the charge storage layer, the two ends of the charge storage layer can be sealed by the oxide layer to prevent charge loss from the two ends of the charge storage layer, thereby improving the data retention capacity and the reliability of the memory device. In addition, in the manufacturing method of the memory structure in the above embodiments, the sidewall damage caused by the etching process can be repaired by the oxidation process.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory structure, comprising:
   a substrate;
   a first dielectric layer disposed on the substrate;
   a second dielectric layer disposed on the first dielectric layer;
   a charge storage layer disposed between the first dielectric layer and the second dielectric layer;
   an oxide layer located at two ends of the charge storage layer and disposed between the first dielectric layer and the second dielectric layer;
   a conductive layer disposed on the second dielectric layer; and
   an isolation structure located in the substrate, wherein an upper surface of the isolation structure has a recess, and the recess is adjacent to the substrate.

2. The memory structure according to claim 1, wherein the oxide layer is connected between a bottom surface of the second dielectric layer and a top surface of the first dielectric layer.

3. The memory structure according to claim 1, wherein the first dielectric layer, the second dielectric layer, and the oxide layer surround the charge storage layer.

4. The memory structure according to claim 1, wherein the conductive layer covers a sidewall of the oxide layer.

5. The memory structure according to claim 1, wherein a material of the first dielectric layer comprises oxide, a material of the second dielectric layer comprises oxide, and a material of the charge storage layer comprises nitride.

6. The memory structure according to claim 1, wherein the oxide layer is located above the isolation structure.

7. The memory structure according to claim 1, wherein a portion of the first dielectric layer, a portion of the charge storage layer, and a portion of the second dielectric layer are located above the isolation structure.

* * * * *